(12) United States Patent
Yoshida et al.

(10) Patent No.: US 8,927,054 B2
(45) Date of Patent: Jan. 6, 2015

(54) CONDUCTIVE SUBSTRATE AND PROCESS FOR PRODUCING SAME

(75) Inventors: Manabu Yoshida, Tsukuba (JP); Toshihide Kamata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 175 days.

(21) Appl. No.: 13/503,632

(22) PCT Filed: Nov. 18, 2010

(86) PCT No.: PCT/JP2010/070533
§ 371 (c)(1),
(2), (4) Date: Apr. 23, 2012

(87) PCT Pub. No.: WO2011/065271
PCT Pub. Date: Jun. 3, 2011

(65) Prior Publication Data
US 2012/0222890 A1    Sep. 6, 2012

(30) Foreign Application Priority Data
Nov. 24, 2009   (JP) ................ 2009-266075

(51) Int. Cl.
*H05K 1/03* (2006.01)
*H05K 3/00* (2006.01)
*H05K 3/12* (2006.01)

(52) U.S. Cl.
CPC ...... *H05K 3/1283* (2013.01); *H05K 2203/0143* (2013.01); *H05K 2203/0271* (2013.01); *H05K 2203/0278* (2013.01)
USPC .......................... 427/98.4; 427/98.5; 174/255

(58) Field of Classification Search
None
See application file for complete search history.

(56) References Cited

U.S. PATENT DOCUMENTS

2010/0025088 A1 * 2/2010 Kamata et al. ............. 174/256
2010/0051333 A1   3/2010 Oki et al.

FOREIGN PATENT DOCUMENTS

| JP | 2001-064547 A | 3/2001 |
| JP | 2008-186353 A | 8/2008 |
| JP | 2009-016201 A | 1/2009 |
| WO | 2008/047823 A | 4/2008 |

OTHER PUBLICATIONS

Manabu Yoshida et al., "Applying printed metal patterns fabricated by using low tempreture process to electronic devices", Proceedings of the 19th Microelectronics Symposium, Sep. 2009, pp. 21-24.
Manabu Yoshida et al., "Development of low-tempreture fabrication technique for printing metal patterns", Proceedings of the 23rd Japan Institute of Electronics Packaging Annual Meeting, 2009, pp. 29-30.
The International Search Report (ISR) mailed on Feb. 15, 2011, issued by the Japanese Patent Office for International Patent Application PCT/JP2010/070533.

* cited by examiner

*Primary Examiner* — Sheeba Ahmed
(74) *Attorney, Agent, or Firm* — Law Office of Katsuhiro Arai

(57) ABSTRACT

Provided are a conductive substrate which can be produced from inexpensive materials at a lower temperature than those for conventional substrates, and a process for producing the conductive substrate. The conductive substrate comprises a substrate (1) and a conductive pattern (5) provided on the substrate (1), wherein the conductive pattern (5), except on a surface and in a vicinity thereof on a side opposite to the substrate side, entirely has a structure comprising a binder (2) and fine aluminum grains (3) dispersed therein, and on the surface and in the vicinity a surface metal aluminum layer (4) is formed in which the fine aluminum grains (3) are spread with a roller to form a conductive junction connecting the fine aluminum grains to each other.

8 Claims, 5 Drawing Sheets

CONDUCTIVE SUBSTRATE AND PROCESS FOR PRODUCING SAME

This application is the U.S. National Phase under 35 U.S.C. §371 of International Application PCT/JP2010/070533, filed on Nov. 18, 2010, which claims priority to Japanese Patent Application No. 2009-266075, filed on Nov. 24, 2009. The International Application was published under PCT Article 21(2) in a language other than English.

TECHNICAL FIELD

The present invention relates to a conductive substrate having a conductive pattern formed on a substrate, particularly a conductive substrate having a conductive pattern whose main constituent is aluminum, as well as a method of manufacturing the same.

PRIOR ART

To date, many methods involving printing have been reported for forming a metal pattern as a conductive pattern on a substrate. When forming a metal pattern by printing, the same pattern can be formed in large numbers at high speed once a plate is made. Also, printing provides a production process characterized by low energy consumption and low environmental impact because it does not require any other additional process such as vacuuming, or photolithography.

However, the mainstream of the conductive pastes reported so far is a silver paste (refer to Patent Literatures 1 and 2), which presents problems as the price of silver metal escalates and fluctuates, etc.

In addition, devices such as organic electroluminescent devices, battery cells, diodes and the like that are considered the targets of metal pattern technology application are generally produced by combining electrodes of high and low work functions, and it is difficult to produce these devices using just one type of silver ink.

On the other hand, as the inventors of the present invention previously reported on printed aluminum wires, printed aluminum wires have high resistivity and using them for devices would require further resistivity reduction (refer to Non-patent Literatures 1 and 2).

PRIOR ART LITERATURES

Patent Literatures

Patent Literature 1: Japanese Patent No. 2009-16201
Patent Literature 2: Japanese Patent No. 2008-186353

Non-Patent Literatures

Non-patent Literature 1: Manabu Yoshida et al., Proceedings of the 19th Microelectronics Symposium, 2009, P. 21
Non-patent Literature 2: Manabu Yoshida et al., Proceedings of the 23rd Japan Institute of Electronics Packaging Annual Meeting, 2009, P. 29

SUMMARY OF THE INVENTION

Problems to be Solved by the Invention

Devices produced by printing tend to have electrical characteristics that are inferior to those of devices produced by a general semiconductor process. This has to do with the fact that, when a printing process is applied, a material conductor, semiconductor, dielectric substance, etc., is converted to ink for forming an electric circuit on a film substrate. Functional inks (inks used for industrial inkjet printing and superfine inkjet printing, made by converting a functional material into ink; various types of inks such as superfine metal grain inks, conductive polymer inks, transparent electrode material inks, and fluorescent inks have been developed) are prepared through proper mixing of various substances, such as functional fine grains, binder, a surface active agent and solvent, in order to ensure printability. Electrical characteristics of a print pattern produced using a functional ink depends strongly on the connecting condition of functional fine grains dispersed in the ink.

For the above reason, production of a low-resistivity metal wire using a general metal ink, for example, requires not only a process to form a pattern by printing, but also a process to heat to remove the solvent and dried, and a high-temperature sintering process to sinter voids among fine metal grains. Among these processes, the sintering temperature is a major factor that limits the selection of substrate material. Currently metal inks using nano metal grains are actively studied to find a way to lower the sintering temperature, and resistivity of approx. $2.0 \times 10^{-6}$ $\Omega \cdot$cm, which is close to the resistivity of bulk silver ($1.6 \times 10^{-6}$ $\Omega \cdot$cm), has been achieved at sintering temperatures around 200° C. to 250° C.

However, sintering temperatures of 200° C. to 250° C. are still too high to be applied to inexpensive resin substrates such as PET (polyethylene terephthalate), and also inks using nano metal grains are very expensive, and these factors are creating barriers for this technology to be widely adopted in the market. In addition, it is impossible with any technology available at the moment to convert those materials that are very easily oxidized, such as aluminum, into nano metal grains.

For this reason, to make a printed aluminum pattern conductive, it is necessary to form metallic junctions between fine aluminum grains constituting a printed aluminum pattern.

In light of the aforementioned problems, it is an object of the present invention to provide a conductive substrate that can be manufactured using an inexpensive material at temperatures lower than the levels required by conventional substrates, as well as a method of manufacturing such a conductive substrate.

It is another object of the present invention to provide a method associated with a smaller deformation ratio of print pattern width when stress is applied.

Means for Solving the Problems

To achieve the aforementioned objects, the present invention adopts a means whereby a conductive paste, which is made by dispersing an appropriate amount of fine aluminum grains of spherical, scale-like (resembling fish scales), branch-like (shape of metal crystal resembling a small branch growing radially in an axial direction of crystal from a fine crystal nucleus) or other shape in a binder made of an insulating resin, is used to form a film-forming pattern on a substrate by a film-forming means, after which the film-forming pattern is heated to remove the solvent in the film-forming pattern and dried, and then stress is applied efficiently to the metal crystallites constituting the fine aluminum grains in the film-forming pattern to distort the crystal lattice, followed by breaking of the insulating aluminum oxide film formed on the surface of fine aluminum grains, to form a conductive junction connecting the fine aluminum grains to each other. Note that the term "powder" used below refers to powder made of the aforementioned fine grains.

To achieve the aforementioned objects, the present invention adopts the specific means for solving the problems as described in (1) to (10) below:

(1) The conductive substrate comprises a substrate and a conductive pattern provided on the substrate, wherein the conductive pattern has a structure whereby fine aluminum grains are dispersed entirely in a binder except on a surface and in a vicinity thereof on the side opposite to the substrate side, and on the surface and in the vicinity a surface metal aluminum layer is formed in which fine aluminum grains are spread with a roller to form a conductive junction connecting the fine aluminum grains to each other.

(2) The surface metal aluminum layer on the conductive substrate is formed by using a conductive paste having a given amount of fine aluminum grains dispersed in a binder to form a film-forming pattern on a substrate by a film-forming means, and by pressurizing the surface of the film-forming pattern containing fine aluminum grains in both the horizontal direction and vertical direction, under heating.

(3) The substrate constituting the conductive substrate is a plastic substrate.

(4) The value of resistivity of the conductive pattern on the conductive substrate is given in a range of $1 \times 10^{-4}$ Ω·cm or lower but $2.65 \times 10^{-6}$ Ω·cm (resistivity of metal aluminum) or higher.

(5) The value of resistivity of the conductive pattern on the conductive substrate is given in a range of $1 \times 10^{-4}$ Ω·cm or lower but $2.65 \times 10^{-6}$ Ω·cm or higher, and when pressure is applied to the crystal lattice of crystallites in the fine aluminum grains constituting the conductive pattern, the lattice is distorted by at least 0.1% compared to the state after printing/heating for removal of solvent, so that this distortion of the lattice can be observed as a peak shift of 0.05° or more on an X-ray diffraction graph representing the aluminum crystal (111) plane.

(6) Under the method of manufacturing a conductive substrate, a conductive paste having a given amount of fine aluminum grains dispersed in a binder, being a solvent made of an insulating resin, is used to form a film-forming pattern on a substrate by a film-forming means, and the film-forming pattern is heated to remove the solvent in the film-forming pattern and dried, after which the surface of the film-forming pattern containing fine aluminum grains is pressurized in both the horizontal direction and vertical direction, under heating, to produce a conductive pattern.

(7) Under the method of manufacturing a conductive substrate, the substrate is a plastic substrate.

(8) Under the method of manufacturing a conductive substrate, the value of a process temperature used as a temperature of the heating when the conductive pattern is produced is given in a range of 150° C. or lower but exceeds 0° C.

(9) Under the method of manufacturing a conductive substrate, the value of resistivity of the conductive pattern is given in a range of $1 \times 10^{-4}$ Ω·cm or lower but $2.65 \times 10^{-6}$ Ω·cm or higher, and when pressure is applied to the crystal lattice of crystallites in the fine aluminum grains constituting the conductive pattern, the lattice is distorted by at least 0.1% compared to the state after printing/heating for removal of solvent, so that this distortion of the lattice can be observed as a peak shift of 0.05° or more on an X-ray diffraction graph representing the aluminum crystal (111) plane.

(10) Under the method of manufacturing a conductive substrate, a film-forming pattern is formed to provide an aspect ratio of the conductive pattern of 0.1 or less after the film-forming pattern is heated and dried, and that a deformation ratio of the pattern width when comparing the pattern width after heating/drying and the pattern width after pressurization is within 10%.

Effects of the Invention

The manufacturing method proposed by the present invention allows for formation of a conductive junction connecting fine aluminum grains to each other as stress is applied efficiently to the metal crystallites constituting the fine aluminum grains to distort the crystal lattice, and the insulating aluminum oxide film formed on the surface of fine aluminum grains is broken.

To be specific, a film-forming pattern (for example, a print pattern) is formed using a conductive paste (containing a binder) made of fine aluminum grains that easily produce an insulating metal oxide on the surface of fine grains, after which the film-forming pattern is heated to remove the solvent in the film-forming pattern and dried, and then stress is applied to the surface of the film-forming pattern in both the horizontal direction and vertical direction, under heating, and then the insulating aluminum oxide film formed on the surface of fine aluminum grains is broken to form a favorable conductive junction connecting fine aluminum grains to each other.

With a conductive substrate conforming to the present invention, the conductive pattern has a structure whereby fine aluminum grains are fully dispersed in the binder except on the surface and in a vicinity thereof on the side opposite to the substrate side. Accordingly, the conductive pattern virtually has a layer formed on the substrate side in which fine aluminum grains are dispersed in the binder resin, while on the surface and in a vicinity thereof on the side opposite to the substrate side, a surface metal aluminum layer is formed in which fine aluminum grains are spread with a roller to form a conductive junction connecting the fine grains to each other, and therefore a conductive layer can be formed reliably with the surface metal aluminum layer, while a semiconductive layer can be formed reliably with the layer in which fine aluminum grains are dispersed in the binder resin.

Such a conductive substrate on which a conductive pattern whose main constituent is aluminum is formed, and the manufacturing method thereof, do not have limited applications, but instead they can be applied to various devices having a conductive part such as device electrodes, metal wires, antennas and the like, to form a favorable conductive junction.

DESCRIPTION OF THE SYMBOLS

Figure 1:
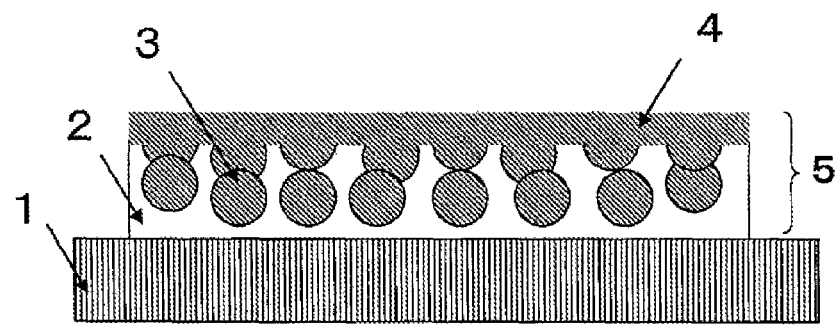
[FIG. 1] is a schematic view showing a section of a conductive pattern whose main constituent is aluminum as proposed by the present invention.

1 Substrate
2 Binder resin
3 Fine aluminum grain
4 Surface metal aluminum layer
5 Conductive pattern
11 Fine aluminum grain
12 Binder resin
13 Substrate
14 Aluminum oxide layer
15 Surface metal aluminum layer
30 Manufacturing apparatus
31 Support base
32 Stage
33 Substrate
34 Film-forming pattern
35 Pressure roller
36 Rotational shaft
37 Rotational direction
38 Z-axis direction
39 Profile line
40 Gap Gr-s
41 X-axis direction
42 Y-axis direction
43 Specified depth
44 Radius of pressure roller
45 Stage control part
46 Pressure roller control part
47 Manufacturing process control part
48 Rotational body
49 Rotational shaft
50 Eccentric roller
51 Eccentric shaft
52 Point
53 Rotational direction
54 Locus
55 Eccentric roller control part
56 Rotational body control part
57 Manufacturing process control part
58 Interval
59 Gap Gr-s
60 Manufacturing apparatus
71 Characteristics of diffraction peak shifted to low-angle side
72 Characteristics of original diffraction peak
73 Characteristics of diffraction peak shifted to high-angle side
74 Crystal lattice receiving tensile stress
75 Original crystal lattice
76 Crystal lattice receiving compressive stress
Pv Pressure in Z-axis direction
Ph Force applied in the horizontal direction along the XY plane

BEST MODE FOR CARRYING OUT THE INVENTION

An embodiment of the present invention is explained in detail using the drawings.

(A Conductive Substrate on which a Conductive Pattern whose Main Constituent is Aluminum is Provided)

FIG. 1 is a section view of a conductive substrate on which a conductive pattern whose main constituent is aluminum is provided on the substrate as proposed by the present invention.

As shown in FIG. 1, the conductive substrate according to the present invention has a conductive pattern 5 provided on the substrate 1. The conductive pattern 5 has a structure whereby fine aluminum grains 3 are dispersed entirely in a binder 2 except "on the surface and in a vicinity thereof" on the side opposite to the substrate 1 side (hereinafter referred to as the "pressurization surface side" of the conductive pattern), and a surface metal aluminum layer 4 is formed on the "pressurization surface side" of the conductive pattern. The ratio of fine aluminum grains 3 to the binder 2 is determined by the size of the fine aluminum grain 3, but it also varies according to the characteristics required of the conductive pattern 5 such as conductivity and resistivity.

This surface metal aluminum layer 4 is formed by a manufacturing method unique to the present invention as described below:

A conductive paste, which is made by dispersing the necessary amount (amount according to the required conductivity, resistivity, etc., of the conductive pattern 5) of fine aluminum grains of spherical, scale-like (resembling fish scales), branch-like (shape of metal crystal resembling a small branch growing radially in an axial direction of crystal from a fine crystal nucleus) or other shape in a binder made of an insulating resin, is used to form a film-forming pattern (for example, a print pattern) on a substrate by a film-forming means such as printing and coating, after which the film-forming pattern is heated to remove the solvent in the film-forming pattern (in other words, the solvent is evaporated and dried/solidified) and dried, and then pressure is applied to the surface of the film-forming pattern (for example, the print pattern) containing fine aluminum grains in both the horizontal direction (for example, the same direction as the surface of the substrate) and vertical direction (for example, the direction perpendicular to the surface of the substrate), under heating (to promote sintering of voids between fine grains), to form a surface metal aluminum layer 4.

Among the aforementioned processes, the process to "form a film-forming pattern (for example, a print pattern) by a film-forming means, after which the film-forming pattern is heated to remove the solvent in the film-forming pattern and dried" is referred to as the "film-forming/heating for removal of solvent" process. Particularly when the film-forming means is printing and the film-forming pattern is a print pattern, this "film-forming/heating for removal of solvent" process is referred to as the "printing/heating for removal of solvent" process.

Also, the process in which "pressure is applied to the surface of the film-forming pattern containing fine aluminum grains in both the horizontal direction and vertical direction" is referred to as the "pressurization" process.

Figure 2:
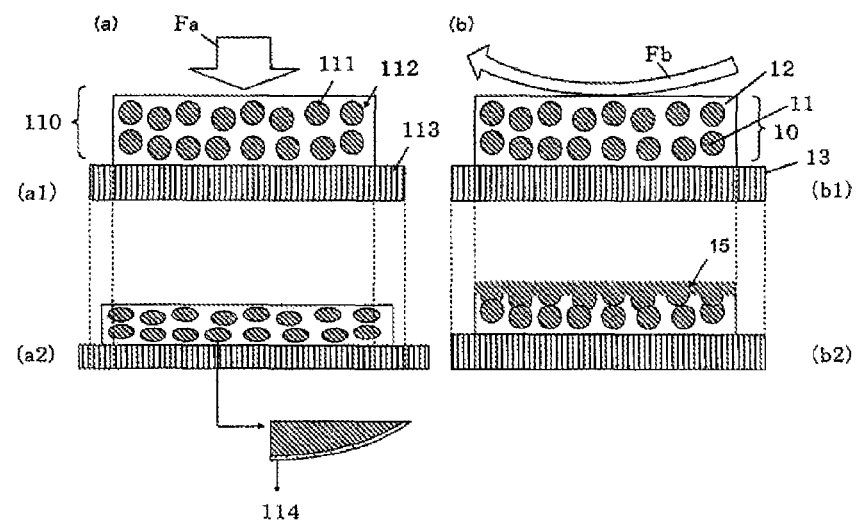
[FIG. 2] is a schematic view showing how to produce a conductive pattern whose main constituent is aluminum as proposed by the present invention.

The means for applying pressure to the surface of the film-forming pattern in the horizontal direction (for example, the same direction as the surface of the substrate) and vertical direction (for example, the direction perpendicular to the surface of the substrate), and means for heating (to promote sintering of voids between fine grains), are explained in detail using FIG. 2.

The binder 2 layer basically has a thickness, in the direction perpendicular to the top face of the substrate 1, spanning from the side contacting the substrate 1 to the side where the surface metal aluminum layer 4 contacts outside air (pressurization surface side), and this thickness is equal to or greater than the size of the fine aluminum grain 3. Desirably the surface metal aluminum layer 4 and fine aluminum grain 3 layer should be present in this binder 2 layer in a section viewed vertically to the substrate surface, but it is permitted that only the surface metal aluminum layer 4 is present.

There is a tendency that, in the surface metal aluminum layer 4, fine aluminum grains 3 on the pressurization surface side form a conductive junction connecting adjacent fine grains to each other in such a way as to break the insulating aluminum oxide film and are thereby (crushed and) roughly flattened, while fine aluminum grains 3 on the side opposite to the pressurization surface side (side closer to the substrate) partially maintain their original shape (spherical shape in this example). This tendency varies according to how much pressure is applied.

The following describes the substances constituting the respective parts of the conductive substrate and the manufacturing method thereof The material for the substrate 1 is not specifically limited and any material can be used as long as it is normally used. In general, flexible film substrate can be used; favorable materials include plastic substrate made of polyethylene terephthalate (PET) and polyethylene naphthalate (PEN), and the like. In addition, a plastic substrate made of polycarbonate (PC), polyimide (PI), polyether sulfone (PES), polyacrylate (PAR), polyether ketone (PEEK), or preferably a plastic film substrate or ceramic film such as a green sheet can be used. The thickness of the substrate is not specifically limited, but a value between 10 μm and 1000 μm is desirable, partly because enough strength to stably retain the elements is needed, and partly because flexibility is also required in some cases.

The material constituting the binder 2 is not specifically limited as long as it is an insulating resin, but materials such as acrylic resin, polycarbonate, polyvinyl butyral, polystyrene, polyimide, polyamide imide, polyester, epoxy resin, conductive polymer material, parylene, silazane-type material or siloxane-type material and the like is preferred.

The material for the fine aluminum grain 3 is not specifically limited and any fine aluminum grain can be used as long as it is a fine grain of spherical, scale-like (resembling fish scales), branch-like (shape of metal crystal resembling a small branch growing radially in an axial direction of crystal from fine crystal nucleus) shape, and as long as they are made of a normally used aluminum metal. The following explanation assumes that the fine aluminum grain 3 has a spherical shape. The fine aluminum grain 3 is not specifically limited as long as it can be embedded in the binder 2 layer, but a grain size in a range of 1 μm to 100 μm is favorable, partly because the smaller the fine grain, the greater the influence it receives from the surface oxide film, and partly because a large fine grain is subject to limitations on the film-forming means and especially patterning becomes difficult when printing is used as the film-forming means. Note that the term "powder" used below refers to powder made of the aforementioned fine grains.

The method for mixing the binder 2 and fine aluminum grains 3 is not specifically limited and any method can be used as long as it is normally used. In general, favorable methods include methods such as the ball mill agitation method, planetary agitation method, supersonic agitation method, 3-roller method, and the like.

The method for forming a pattern using the mixed paste of binder 2 and fine aluminum grains 3 is not specifically limited and any method can be used as long as it is normally used. In general, favorable pattern forming methods include methods such as the screen printing method, gravure printing method, offset printing method, inkjet printing method, doctor blade method, slit coater method, dispensing method, micro contact print method, nano imprint method, and the like.

With a conductive substrate according to the present invention, the conductive pattern has a structure whereby fine aluminum grains are dispersed entirely in the binder except on the surface and in a vicinity thereof on the side opposite to the substrate side. Accordingly, the conductive pattern virtually has a layer formed on the substrate side in which fine aluminum grains are dispersed in the binder resin, while on the surface and in a vicinity thereof on the side opposite to the substrate side, a surface metal aluminum layer is formed in which fine aluminum grains are spread with a roller to form a conductive junction connecting the fine grains to each other, and therefore a conductive layer can be formed reliably with the surface metal aluminum layer, while a semiconductive layer can be formed reliably with the layer in which fine aluminum grains are dispersed in the binder resin.

(Method of Manufacturing a Conductive Pattern whose Main Constituent is Aluminum)

FIG. 2 shows a section view of a manufacturing process for a conductive pattern whose main constituent is aluminum as proposed by the present invention, and a schematic view illustrating the pressurization method.

For comparison, FIG. 2(a) shows how the aluminum pattern changes when the general heating pressurization method is applied, while FIG. 2(b) shows how the conductive pattern corresponding to the aluminum pattern changes when the heating pressurization method according to the present invention is applied. FIG. 2(a) includes FIG. 2(a)(a1) and FIG. 2(a)(a2). FIG. 2(b) includes FIG. 2(b)(b1) and FIG. 2(b)(b2).

The general heating pressurization method shown in FIG. 2(a) is generally called the roll press method, whereby a sample is sandwiched between the two rollers (having a heater unit) and pressurized. For example, the roll press manufactured by Nitto Hannoki, as mentioned later, applies this method. Under the general heating pressurization method, first, as shown in FIG. 2(a)(a1), a conductive paste, which is made by dispersing an appropriate amount of spherical fine aluminum grains 111 in a binder 112 made of an insulating resin, is used to form a film-forming pattern 110 on a substrate 113 by a film-forming means, after which the film-forming pattern is heated while applying a force Fa to the surface of the film-forming pattern containing the fine aluminum grains in the vertical direction (for example, the direction perpendicular to the surface of the substrate), to achieve heating and solidification as shown in FIG. 2(a)(a2).

If the general heating pressurization method shown in FIG. 2(a) is applied, pressure is applied to the substrate 113 only in the vertical direction and the stress generated in the film-forming pattern is dispersed into the stress acting upon the fine aluminum grains 111 and stress acting upon the binder resin 112, and this prevents efficient distortion of the crystal lattice of crystallites in the fine aluminum grains 111. As a result, as shown by the arrow in the partially enlarged view of fine aluminum grains 111 in FIG. 2(a)(a2), an aluminum oxide layer 114 remains on the surface of fine aluminum grains 111 and a conductive junction is not formed between adjacent fine aluminum grains 111.

Under the heating pressurization method according to the present invention shown in FIG. 2(b), on the other hand, first, as shown in FIG. 2(b)(b1), a conductive paste, which is made by dispersing an appropriate amount of spherical fine aluminum grains 11 in a binder 12 made of an insulating resin, is used to form a film-forming pattern 10 on a substrate 13 by a film-forming means such as printing and coating, after which the film-forming pattern 10 is heated to remove the solvent in the film-forming pattern 10 and dried, and then pressure is applied to the surface of the film-forming pattern 10 (for example, a print pattern) containing the fine aluminum grains 11 in both the horizontal direction (for example, the same direction as the top face of the substrate) and vertical direction (for example, the direction perpendicular to the top face of the substrate), under heating (to promote sintering of voids between fine grains), to form a surface metal aluminum layer 15 as shown in FIG. 2(b)(b2).

Here, "pressure is applied in both the horizontal direction and vertical direction" basically means that the pattern is moved horizontally while pressure is applied to it vertically, but it can also mean, for example, that a force Fb is applied to the surface side of the film-forming pattern 10 made of the conductive paste in a manner drawing an arc as shown in FIG. 2(b)(b1), in which case the force Fb is applied, in a manner drawing an arc, to the binder 12 and fine aluminum grains 11 present on the surface side of the film-forming pattern 10 made of the conductive paste. This process is performed over the entire surface side of the conductive paste.

Use of the heating pressurization method according to the present invention as shown in FIG. 2(b) allows pressure to be applied to the surface side of the film-forming pattern 10 made of the conductive paste in both the horizontal direction and vertical direction, so the binder 12 is removed by the pressure component applied in the horizontal direction and when the surface of the fine aluminum grains 11 is exposed, further pressure (since the location of the conductive paste where the force Fb contacts is not a line but an area of a certain size, the pressure acts upon the same location continuously) is applied, and therefore the fine aluminum grains 11 are spread with a roller and a conductive junction is formed between fine grains, and the surface metal aluminum layer 15 is formed as a result.

Here, although a member that causes the force Fb to act upon the film-forming pattern 10 made of the conductive paste is not illustrated, a roller, etc., provided on an eccentric shaft can be used, for example. In this case, the eccentricity of the rotational shaft supporting the roller allows the roller to rotate and at the same time apply the force Fb in an arc motion, as shown in FIG. 2(b), as the eccentric shaft turns.

At this time, crystallites in adjacent fine aluminum grains 11 form a junction due to pressure, and the crystal lattice is distorted where this junction is formed.

As for deformation of the pattern width, when the general heating pressurization method as shown in FIG. 2(a) is applied, the conductive pattern does not change its volume and the film becomes thinner, resulting in an increase in the pattern width. When the heating pressurization method according to the present invention as shown in FIG. 2(b) is applied, on the other hand, excess binder is removed by the pressure applied in the horizontal direction and therefore the change in pattern width is kept small.

EXAMPLES

Next, examples of a manufacturing apparatus and manufacturing method for implementing the heating pressurization method under the present invention are given.

Figure 3:
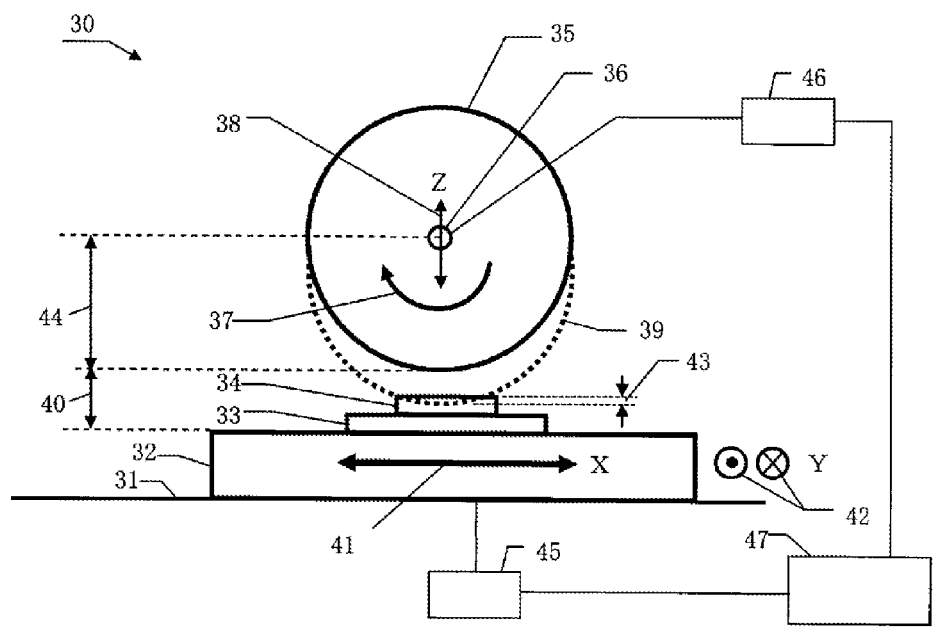
[FIG. 3] shows Example 1 of a manufacturing apparatus conforming to the present invention.

FIG. 3 shows Example 1 of a manufacturing apparatus for implementing the method of manufacturing a conductive substrate as proposed by the present invention.

This manufacturing apparatus 30 primarily has, on a support base 31, a stage 32 that can be controlled to move freely in the XY directions, a pressure roller 35 that can be controlled to move freely in the Z direction while rotating, a control unit (comprising 45 to 47), and a support mechanism (not illustrated) for retaining the stage 32 and pressure roller 35 in a pre-determined relationship prior to control.

The stage 32 has a drive means equipped with a motor or other drive source and is supported on the support base 31 in a manner freely movable in the X-axis direction 41 and Y-axis direction 42 of the plane, where the rotational direction (one direction or back and forth), rotational speed, stopping position, etc., are controlled by the stage control part 45. The travel distance and number of back-and-forth movements per unit time in the case of back-and-force movement can be set arbitrarily by the stage control unit 45. A substrate 33 with a film-forming pattern 34 is placed on the stage 32 to apply the manufacturing method under the present invention.

On the support base 31, a rotational shaft 36 of the pressure roller 35 is placed in such a way that the outer periphery facing part of the pressure roller 35 will be positioned away from the top face of the stage 32 by a specified interval corresponding to a gap Gr-s 40 between the pressure roller and stage. This means, for example, that the center of the rotational shaft 36 can be controlled at the position away from the top face of the stage 32 in the Z-axis direction by a length corresponding to "Radius 44 of the pressure roller 35+Gap Gr-s 40." The center of the rotational shaft 36 is parallel with the top face of the stage 32.

The interval of gap Gr-s 40 includes a clearance needed to prevent the facing pressure roller 35 from contacting the film-forming pattern 34 before control of the manufacturing process is started.

The rotational shaft 36 is provided in a manner controllable to rotate and also move in the Z-axis direction freely. The rotational shaft 36 is connected to the rotational shaft (not illustrated) of a motor (not illustrated) used as a drive source. The rotational shaft 36 has a structure (not illustrated) whereby it can move in the Z-axis direction 38 while still connected to the rotational shaft of the motor, and is provided on a support mechanism (not illustrated). For example, the motor connected to the rotational shaft 36 of the pressure roller 35 is installed on one side of a structure having a rough L-shape (not illustrated), and the other side of this structure having a rough L-shape (not illustrated) is made movable vertically (in the Z-axis direction 38) relative to the support base 31. This structure that can move vertically (in the Z-axis direction 38) may be constructed by combining a straight gear with a rotational gear provided on the rotational shaft of the motor, by making the facing member a piezoelectric motor, and so on.

The pressure roller control part 46 controls the rotational direction 37 (one direction or back and forth), rotational speed, stopping position, etc., of each of the multiple motors mentioned above, and controls the rotation and movement in the Z-axis direction of the rotational shaft 36.

The control unit comprises the pressure roller control part 46, stage control part 45 and manufacturing process control part 47. The manufacturing process control part 47 controls the entire control parts.

Next, the manufacturing process based on the heating pressurization method under the present invention is explained using the example in FIG. 3.

As a preliminary step, a conductive paste of a specified composition is printed onto the substrate 33 to form a print pattern and this print pattern is dried at the process temperature, and the substrate 33 having this dried film-forming pattern 34 is placed on the stage 32.

At this time, the manufacturing process control part 47 stores, in a storage means (not illustrated), respectively, the gap Gr-s 40 between the pressure roller and stage (length from the top face of the stage 32 to the center of the rotational shaft 36 is used as a control parameter), thicknesses of the substrate 33 and film-forming pattern 34 in the Z-axis direction, etc. The means for acquiring each of the above values is selected from among those means apparent to those skilled in the art.

Also, the pressing force of the pressure roller 35 to be applied to the film-forming pattern 34 is stored beforehand in a table (storage means) as the relationship between the value of "Radius 44 of the pressure roller 35+Gap Gr-s 40" indicating the amount of movement control of the rotational shaft 36 in the Z-axis direction on one hand, and the value of the pressure sensor (not illustrated) to be applied to the film-forming pattern of the sample on the other.

In this way, via the control operation of the pressure roller control part 46 based on execution of control steps in the manufacturing process control part 47 governing general control, rotation control of the rotational shaft 36 of the pressure roller 35 is performed (for example, control of operation in one direction or back-and-forth operation, control of center angle range and number of back-and-forth operations per unit time in the case of back-and-force operation, speed control, control of number of rotations, etc.), while movement control of the rotational shaft 36 in the Z-axis direction is performed at the same time. Rotation control can be started at any time when the pressing force of the pressure roller 35 applied to the film-forming pattern 34 is anywhere between zero and the specified value.

To embody the movement control in the Z-axis direction, first control is performed in a manner reducing the interval of gap Gr-s 40 to cause the pressure roller 35 to contact the film-forming pattern 34, after which the film-forming pattern 34 is pressed by the pressure roller 35 at the specified pressing force.

If the pressure roller 35 is rotating when this happens, not only the pressing force of the pressure roller 35 mentioned above, but also a force applied in the tangential direction of the pressure roller 35, or specifically a force applied in the horizontal direction along the XY plane, act upon the surface of the film-forming pattern 34.

Furthermore, if the stage 32 is drive-controlled in the XY-axis directions, movement of the pressure contact location of the film-forming pattern 34 along the XY plane of the pressure roller 35 causes the pressing force applied in the Z-axis direction and force applied in the horizontal direction along the XY plane to move along the XY plane of the film-forming pattern 34.

Figure 4:
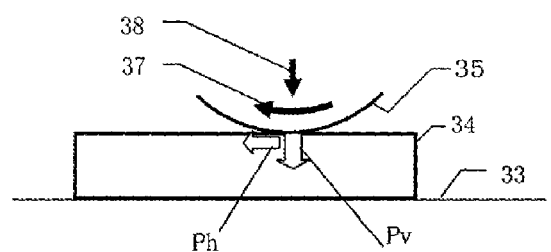
[FIG. 4] is a drawing explaining the forces acting upon a film-forming pattern pertaining to the present invention.

At this stage, the forces acting upon the film-forming pattern 34 are the pressing force applied in the Z-axis direction and force applied in the horizontal direction along the XY plane due to the pressure roller 35. FIG. 4 shows an example of action of the pressing force Pv applied in the Z-axis direction and force Ph applied in the horizontal direction along the XY plane due to the pressure roller 35. FIG. 4 explains how each force acts upon the film-forming pattern.

To create this condition, in FIG. 3 three parameters including the movement of the pressure roller 35, movement of the stage 32, and the gap Gr-s 40 between the pressure roller and stage are controlled in such a way that the following phenomenon occurs. The specific phenomenon is the formation of junction by pressure between the crystallites in adjacent fine metal grains, which is achieved by causing the pressing force applied in the Z-axis direction and force applied in the horizontal direction along the XY plane due to the pressure roller 35 to act upon the film-forming pattern 34 and thereby generate a force equal to or greater than the shear stress of the binder (for example, binder resin) in the film-forming pattern 34, and then breaking this binder while simultaneously causing the fine metal grains such as fine aluminum grains and the like to undergo plastic deformation to break the oxide film on their surface.

Under the conditions of FIG. 4, where the pressing force Pv applied in the Z-axis direction and force Ph applied in the horizontal direction along the XY plane due to the pressure roller 35 are acting upon the film-forming pattern 34 to generate the aforementioned junction, the gap Gr-s 40 is controlled to apply the pressing force in the Z-axis direction in FIG. 3 until the contact position between the pressure roller 35 and film-forming pattern 34 moves from the original position where the binder in the film-forming pattern 34 is not yet broken, to the position of a specified depth 43 where the binder is broken. The position of the pressure roller 35 after movement is indicated by a profile line 39. The stage 32 and heating are also controlled during this period.

The depth 43 position is a position where the film-forming pattern 34 finally changes to the conditions in FIG. 1, or specifically the film-forming pattern 34 finally becomes a conductive pattern, wherein the following occurs: "the conductive pattern 5 has a structure whereby fine aluminum grains 3 are dispersed entirely in a binder 2 except on the "surface and in a vicinity thereof" on the side opposite to the substrate 1 side (hereinafter referred to as the "pressurization surface side" of the conductive pattern), and a surface metal aluminum layer 4 is formed on the "pressurization surface side" of the conductive pattern. The ratio of fine aluminum grains 3 to the binder 2 is determined by the size of the fine aluminum grains 3, but it also varies according to the characteristics required of the conductive pattern 5 such as conductivity and resistivity."

Figure 8:
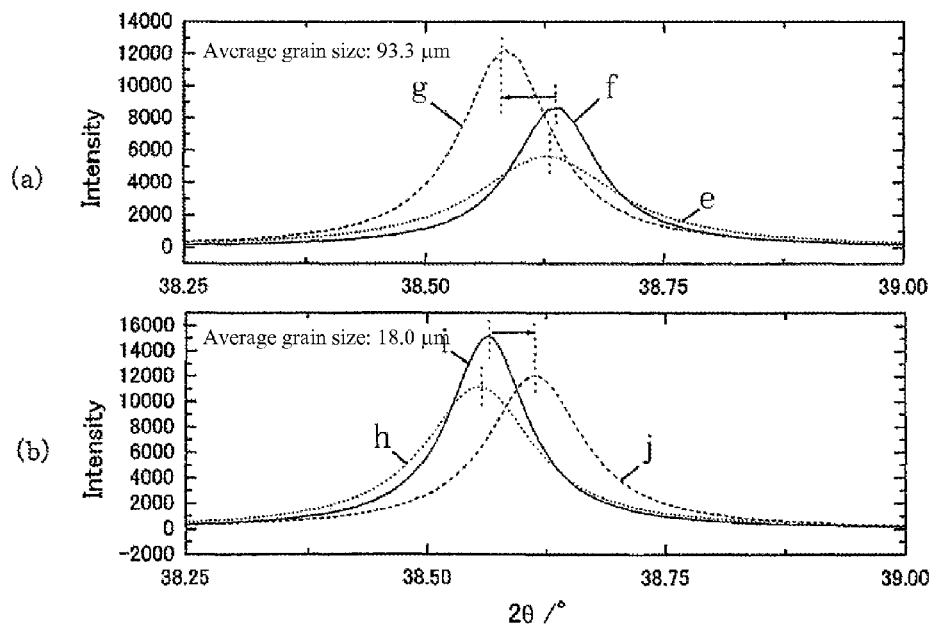
[FIG. 8] is a graph showing how the X-ray diffraction spectrum changes for conductive patterns whose main constituent is aluminum and to which the heating pressurization method according to the present invention and the general roll pressurization method are applied, respectively.

Furthermore, the aforementioned conditions can be explained using a specific example based on X-ray diffraction spectral characteristics relating to a conductive pattern using aluminum powder as shown in FIG. 8.

After the film-forming pattern 34 has taken on a structure having the specified characteristics as a conductive pattern in the final stage of the manufacturing process, the manufacturing process control part 47 drive-controls the pressure roller 35, via the pressure roller control part 46 and stage control part 45, by sequentially moving the pressure roller 35 away from the film-forming pattern 34 in the Z-axis direction, and performs the necessary processing to end the process.

Figure 5:
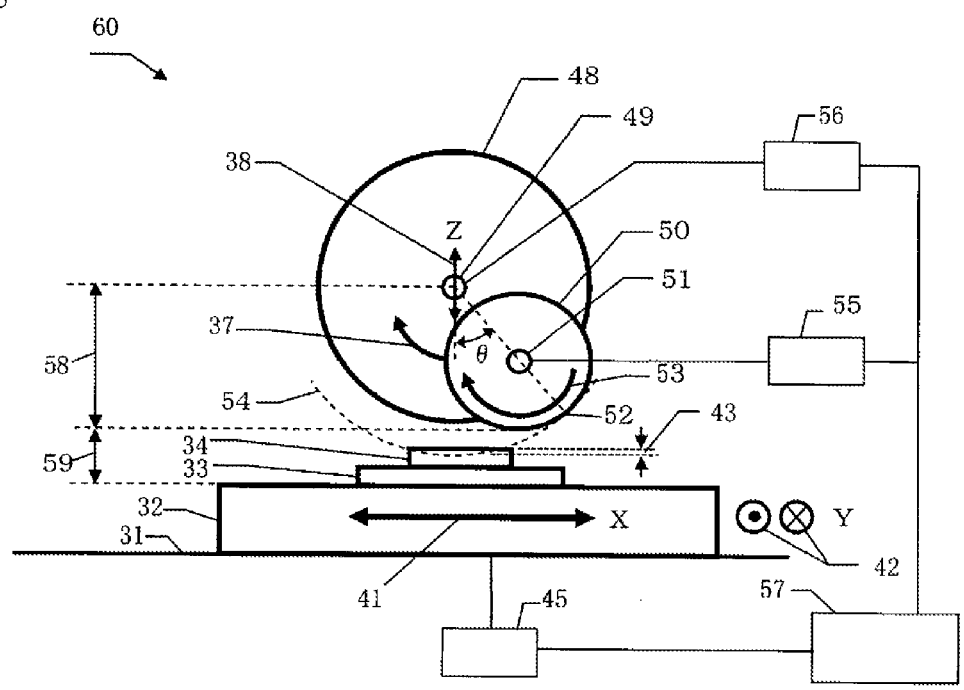
[FIG. 5] shows Example 2 of a manufacturing apparatus conforming to the present invention.

FIG. 5 shows Example 2 of a manufacturing apparatus having a roller on an eccentric shaft, used to generate the arc movement of force Fb shown in FIG. 2(b).

In a manufacturing apparatus 60 in FIG. 5, reference numerals identical to those used in the explanation of the manufacturing apparatus in FIG. 3 have the same technical meanings and are therefore not explained here.

One key structural difference between the example in FIG. 5 and example in FIG. 3 is that an eccentric roller supported on a rotational body is used instead of a pressure roller.

The structure of the example in FIG. 5 is explained below in detail.

A rotational shaft 49 is placed on the support base 31 in a freely rotatable manner at the position away from the top face of the stage 32 by a specified interval corresponding to a gap Gr-s 59 and an interval 58. The centers of the rotational shaft 49 and an eccentric shaft 51 are parallel with the plane of the stage 32.

The interval of gap Gr-s 59 includes a clearance needed to prevent a facing eccentric roller 50 from contacting the film-forming pattern 34 before control operation of the manufacturing apparatus is started in the manufacturing process.

Take note that "Gap Gr-s 59+Interval 58" can be used as a control parameter, for example. This means that, for example, the position of the rotational shaft 49 can be controlled in such a way that the center of the rotational shaft 49 is away from the top face of the stage 32 in the Z-axis direction by a length corresponding to "Gap Gr-s 59+Interval 58."

A rotational body 48 is constituted as a disk, roller, cylinder, etc., for example.

The rotational shaft 49 is provided in a manner controllable to rotate and also move in the Z-axis direction freely, as in the example of the rotational shaft 36 shown in FIG. 3

The rotational shaft 49 is connected to the rotational shaft (not illustrated) of a motor (not illustrated) used as a drive source. The rotational shaft 49 has a structure (not illustrated) whereby it can move in the Z-axis direction 38 while still connected to the rotational shaft of the motor, and is provided on a support mechanism (not illustrated). For example, the motor connected to the rotational shaft 49 is installed on one side of a structure having a rough L-shape (not illustrated), and the other side of this structure having a rough L-shape (not illustrated) is made movable vertically (in the Z-axis direction 38) relative to the support base 31. This structure that can move vertically (in the Z-axis direction 38) may be constructed by combining a straight gear with a rotational gear provided on the rotational shaft of the motor, by making the facing member a piezoelectric motor, and so on.

A rotational body control part 56 controls the rotational direction 37 (one direction or back and forth), rotational speed, stopping position, etc., of each of the multiple motors mentioned above, and controls the rotation and movement in the Z-axis direction of the rotational shaft 49.

The rotational body 48 has the eccentric shaft 51 that serves as a rotational shaft, at an eccentric position away from the center of the rotational shaft 49 and in a freely rotatable manner. The eccentric shaft 51 integrally has the eccentric roller 50.

The eccentric shaft 51 is connected to the rotational shaft (not illustrated) of a motor (not illustrated) used as a drive source. While connected to the eccentric shaft 51, the motor is secured to the rotational body 48 by a support structure (not illustrated), for example. The eccentric shaft 51 is provided in a manner controllable to rotate freely.

In the direction orthogonal to the axial direction of the rotational shaft 49 (radial direction), the length from the center of the rotational shaft 49 to a point 52 on the outer periphery of the eccentric roller 50 (referred to as the "apparent radius A" for the purpose of convenience) along a line extended from the line connecting the center of the rotational shaft 49 and center of the eccentric shaft 51, should be longer than the length to a point on the outer periphery of the rotational body 48 (i.e., radius) on the aforementioned extended line. This relative relationship of the rotational body 48 and eccentric roller 50 causes only the eccentric roller 50 to act upon the film-forming pattern during the heating pressurization under the present invention.

The rotational body 48 can have any range of rotation as long as it is slightly larger than the range within which the eccentric roller 50 acts upon the film-forming pattern 34, as illustrated by a locus 54 of the aforementioned point 52 in FIG. 5, for example.

The gap Gr-s 59 in the Z-axis direction between the eccentric roller 50 and film-forming pattern 34, which provides a parameter used to control the pressure applied to the film-forming pattern 34, is defined as the shortest interval between a point on the outer periphery of the eccentric roller 50 and point on the film-forming pattern 34 as projected onto the Z-axis.

On the other hand, the apparent radius A can be defined as "Length from the center of the rotational shaft 49 to the center of the eccentric shaft 51+Length of the radius of the eccentric roller 50."

The interval 58 is obtained by "(Length from the center of the rotational shaft 49 to the center of the eccentric shaft 51×cos θ)+ Radius of the eccentric roller 50." Here, θ means the angle formed by the line connecting the center of the rotational shaft 49 and center of the eccentric shaft 51, and the Z-axis direction 38.

When the film-forming pattern 34 is heated and pressurized, the eccentric roller 50 is rotated for a given period in a given rotational direction 53 (for example, one direction or both directions, within a given center angle range, etc.) by means of control by an eccentric roller control part 55 under the general control of a manufacturing process control part 57, while at the same time the rotational body 48 is rotated within a given angle range including the center angle θ range pertaining to the heating pressurization of the film-forming pattern, in a given direction (one direction or both directions), to heat and pressurize the film-forming pattern 34.

The eccentric roller control part 55 controls the rotational direction 53 (one direction or back and forth), rotational speed, stopping position, etc., of the motor connected to the eccentric shaft 51, and controls the rotation of the eccentric roller 50.

The control unit comprises the eccentric roller control part 55, rotational body control part 56, stage control part 45 and manufacturing process control part 57. The manufacturing process control part 57 controls the aforementioned control parts 45, 55, 56 as a whole.

Next, the manufacturing process based on the heating pressurization method under the present invention is explained using the example in FIG. 5.

Operations of the rotational body 48 and the eccentric roller 50 linked to this rotational body 48, and control operations of the rotational body control part 56, eccentric roller control part 55 and manufacturing process control part 57 that control the foregoing parts, which are different from what is explained regarding the manufacturing process using the manufacturing apparatus shown in FIG. 3, are mainly explained.

As a preliminary step, a conductive paste of a specified composition is printed onto the substrate 33 to form a print pattern and this print pattern is dried at the process temperature, and the substrate 33 having this dried film-forming pattern 34 is placed on the stage 32.

The manufacturing process control part 57 stores, in a storage means (not illustrated) beforehand, the gap Gr-s 59 between the top face of the stage 32 and center of the rotational shaft 49, the interval 58, thicknesses of the substrate 33 and film-forming pattern 34 in the Z-axis direction, and other values.

The interval 58 is calculated by "(Length from the center of the rotational shaft 49 to the center of the eccentric shaft 51×cos θ)+Radius of the eccentric roller 50" using, as a parameter, the center angle θ formed by the line connecting the point 52 which moves according to the rotation of the rotational shaft 49 and the center of the rotational shaft 49, le;.5qand the Z-axis passing the center of the rotational shaft 49, and the obtained value is stored in a table beforehand.

The means for acquiring each of the above values is selected from among those means apparent to those skilled in the art.

The pressing force of the eccentric roller 50 to be applied to the film-forming pattern 34 is stored beforehand in a table as the relationship between the value of gap Gr-s 59 and value of the pressure sensor (not illustrated) to be applied to the film-forming pattern of the sample.

In this condition, via the control operation of the eccentric roller control part 55 based on execution of control steps in the manufacturing process control part 57 governing general control, rotation control of the rotational shaft 51 of the eccentric roller 50 is performed (for example, control of operation in one direction or back-and-forth operation, control of center angle range and number of back-and-forth operations per unit time in the case of back-and-force operation, speed control, control of number of rotations, etc.), while movement control of the rotational shaft 49 in Z-axis direction is performed at the same time. Rotation control can be started at any time when the pressing force of the eccentric roller 50 applied to the film-forming pattern 34 is anywhere between zero and the specified value. The pressing force of the eccentric roller 50 applied to the film-forming pattern 34 is acquired beforehand using a pressure-sensitive sensor (not illustrated), etc.

The rotational body and eccentric roller can be controlled in various ways. Preferred examples are given below.

(1) With the eccentric roller 50 secured at a given center angle position, the rotational body 48 is moved downward in the Z-axis direction (direction toward the substrate 33) and upon detection of the gap Gr-s 59 reaching the specified interval, the movement is stopped temporarily.

The specified interval is such that, when the rotational body 48 is rotated and the point 52 on the eccentric roller 50 comes to the Z-axis passing the center of the rotational shaft 49, or specifically when the center angle θ becomes zero, the specified vertical direction force acts upon the film-forming pattern 34 due to the eccentric roller 50. This "interval at which the specified vertical direction force acts" represents a given interval that may range from an interval when both are contacting each other to an interval in the pressure condition corresponding to the section structure shown in FIG. 1. This interval is acquired according to the sample before the manufacturing process is executed.

Thereafter, the eccentric roller 50 and rotational body 48 are controlled to rotate in such a way that the point 52 moves along the locus 54, while at the same time the rotational shaft 49 and stage 32 are controlled to move in the vertical direction (Z-axis direction) and in the XY directions, respectively, and a vertical direction force and horizontal direction force are applied to the film-forming pattern 34 with the eccentric roller 50 until the contact position between the eccentric roller 50 and film-forming pattern 34 moves from the original position where the binder in the film-forming pattern 34 is not yet broken, to the position of the specified depth 43 where the binder is broken. As a result, a conductive pattern having the section structure explained in FIG. 1 is finally manufactured, and the manufacturing process ends.

(2) From the beginning the eccentric roller 50 and rotational body 48 are controlled to rotate so that the point 52 moves along the locus 54, while at the same time the rotational shaft 49 and stage 32 are controlled to move in the vertical direction (Z-axis direction) and in the XY directions, respectively, until the eccentric roller 50 contacts the film-forming pattern 34, and a vertical direction force and horizontal direction force are applied to the film-forming pattern 34 with the eccentric roller 50 until the contact position between the eccentric roller 50 and film-forming pattern 34 moves from the original position where the binder in the film-forming pattern 34 is not yet broken, to the position of the specified depth 43 where the binder is broken. As a result, a conductive pattern having the section structure explained in FIG. 1 is finally manufactured, and the manufacturing process ends.

In the example of FIG. 5, too, three parameters including the movement of the eccentric roller 50 and rotational body 48, movement of the stage 32, and the gap Gr-s 59 are controlled in such a way that the following phenomenon occurs, as in the example of FIG. 3. The specific phenomenon is the formation of junction by pressure between the crystallites in adjacent fine metal grains, which is achieved by causing the pressing force applied in the Z-axis direction and force applied in the horizontal direction along the XY plane due to the eccentric roller 50 to act upon the film-forming pattern 34 and thereby generate a force equal to or greater than the shear stress of the binder (for example, binder resin) in the film-forming pattern 34, and then breaking this binder while simultaneously causing the fine metal grains such as fine aluminum grains to undergo plastic deformation to break the oxide film on their surface.

In the condition of FIG. 4, where the pressing force Pv applied in the Z-axis direction and force Ph applied in the horizontal direction along the XY plane due to the eccentric roller 50 are acting upon the film-forming pattern 34 to generate the aforementioned junction, the gap Gr-s 59 is controlled to apply the pressing force in the Z-axis direction in FIG. 5 until the contact position between the eccentric roller 50 and film-forming pattern 34 moves from the original position where the binder in the film-forming pattern 34 is not yet broken, to the position of the specified depth 43 where the binder is broken. The stage 32 and heating are also controlled while the point 52 on the eccentric roller 50 moves along the locus 54.

The depth 43 position is a position where the film-forming pattern 34 finally changes to the condition in FIG. 1, or specifically the film-forming pattern 34 finally becomes a conductive pattern, wherein the following occurs: "the conductive pattern 5 has a structure whereby fine aluminum grains 3 are dispersed entirely in a binder 2 except on the "surface and in a vicinity thereof" on the side opposite to the substrate 1 side (hereinafter referred to as the "pressurization surface side" of the conductive pattern), and a surface metal aluminum layer 4 is formed on the "pressurization surface side" of the conductive pattern. The ratio of fine aluminum grains 3 to the binder 2 is determined by the size of the fine aluminum grains 3, but it also varies according to the characteristics required of the conductive pattern 5 such as conductivity and resistivity."

Furthermore, the aforementioned condition can be explained using a specific example based on X-ray diffraction spectral characteristics relating to a conductive pattern using aluminum powder as shown in FIG. 8.

After the film-forming pattern 34 has taken on a structure having the specified characteristics as a conductive pattern in the final stage of the manufacturing process, the manufacturing process control part 57 drive-controls the eccentric roller 50, via the eccentric roller control part 55, rotational body control part 56 and stage control part 45, by sequentially moving the eccentric roller 50 away from the film-forming pattern 34 in the Z-axis direction, and performs the necessary processing to end the process.

Figure 6:
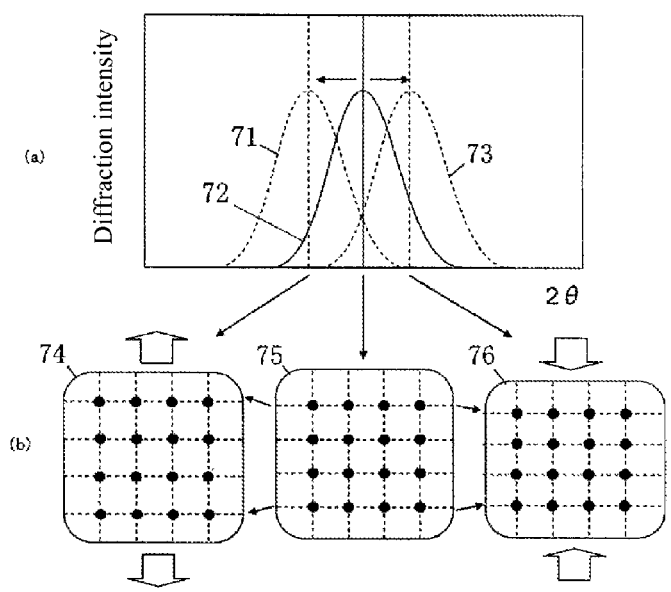
[FIG. 6] is a schematic view explaining how the distortion of the crystal lattice is evaluated using an X-ray diffraction spectrum in a conductive pattern whose main constituent is aluminum as proposed by the present invention.

FIG. 6 shows the lattice distortion characteristics of crystallites in the fine aluminum grains constituting the conductive pattern (FIG. 6(a)), and a drawing explaining the relationship of X-ray diffraction peak shifts (FIG. 6(b)). The horizontal axis of FIG. 6(a) represents angle 2θ, while the vertical axis represents diffraction intensity.

As shown in the lattice image 74 in FIG. 6(b), when a tensile stress is applied to the crystal lattice in the directions of the arrows, the crystal lattice pitch increases. When the X-ray diffraction spectrum is observed at this time, the diffraction peak characteristics 71 appear on a lower-angle side relative to the diffraction peak characteristics 72 of the original crystal lattice pitch.

On the other hand, as shown in the lattice image 76, when a compressive stress is applied to the crystal lattice in the directions of the arrows, the crystal lattice pitch decreases, and the diffraction peak characteristics 73 appear on a higher-angle side relative to the diffraction peak characteristics 72 of the original crystal lattice pitch. Note that each arrow in the figure represents a stress to be applied.

When focusing on the relationships shown in FIG. 6, the crystal lattice of crystallites in the fine aluminum grains constituting the conductive pattern conforming to the present invention is distorted by at least 0.1% when pressure is applied, compared to the state after printing/heating for removal of solvent, and this distortion of the lattice is observed as a peak shift of 0.05° or more on an X-ray diffraction graph representing the aluminum crystal (111) plane.

In the examples of the present invention, aluminum powder 1 manufactured by Alfa Aesar (registered trademark) and having a grain size of 325 mesh or less and purity of 99.5% (metals basis), and aluminum powder 2 also manufactured by Alfa Aesar (registered trademark) and having a grain size of 100 mesh or less but 325 mesh or more and purity of 99.5% (metals basis), were used.

Figure 7:
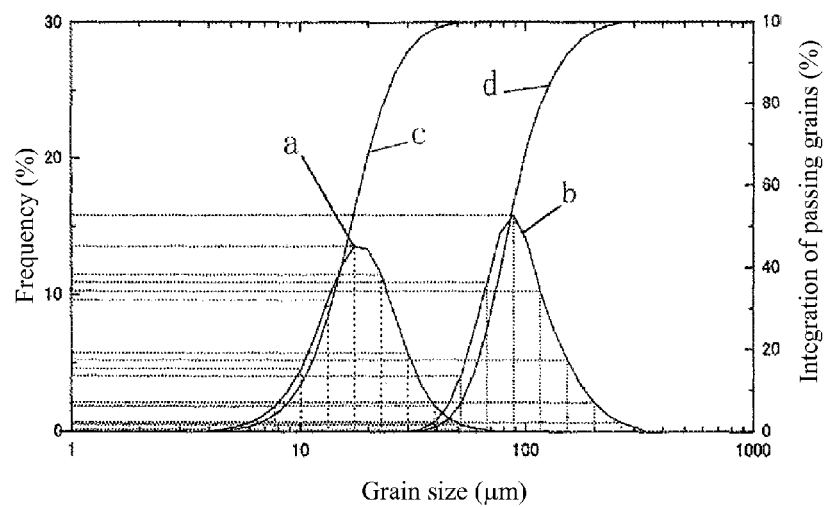
[FIG. 7] is a graph showing grain size distributions of two types of aluminum powders used in the examples of the present invention.

FIG. 7 shows grain size distributions of the aluminum powders used (measured using the laser diffraction/scattering grain size distribution measuring apparatus Partica LA-950V2 manufactured by Horiba).

In FIG. 7, the horizontal axis represents grain size (μm), while the vertical axis (left side of the graph) represents (occurrence) frequency (%). Note that the vertical axis (right side of the graph) represents integrated value of passing grains (integration of frequency curve) (%).

In FIG. 7, Al powder 1 indicates the characteristics a of Al powder (325 mesh or less) with an average grain size of 18.0 μm, while Al powder 2 indicates the characteristics b of Al powder (325 mesh or more but 100 mesh or less) with an average grain size of 93.3 μm.

Note that in FIG. 7, the grain size vs. (occurrence) frequency characteristics draw a gradually increasing curve for Al powder 1 characteristics a and Al powder 2 characteristics b, while the grain size vs. integrated value of passing grains characteristics draw a gradually increasing curve from 0 to 100 for both Al powder 1 characteristics c and Al powder 2 characteristics d.

The average grain size of Al powder 1 was measured as 18.0 μm, while the average grain size of Al powder 2 was measured as 93.3 μm. The substrate was made by Kapton (registered trademark) 300H (film thickness: 75 μm) manufactured by Toray-DuPont.

During the manufacture of conductive patterns, 30 percent by weight of aluminum powder was mixed with Vilomax (registered trademark) manufactured by Toyobo constituting a binder, after which the mixture was agitated for 3 minutes using the planetary agitator ARE-310 to manufacture a conductive paste. Screen printing was performed with this conductive paste, using the screen printer MT-320TV manufactured by Microtech and a screen mask manufactured by Tokyo Process Service. The printed pattern was dried at the process (drying process) temperature of 150° C. (by heating the film-forming pattern to remove the solvent in the film-forming pattern and dried), after which the general roll press method (using the roll press manufactured by Nitto Hannoki) and heating pressurization method according to the present invention were implemented to apply pressures in the horizontal direction (for example, the same direction as the top face of the substrate) and vertical direction (for example, the direction perpendicular to the top face of the substrate) relative to the surface of the film-forming pattern containing fine aluminum grains (for example, the print pattern), under heating (to promote sintering of voids between fine grains). The above process temperature can be given in a range of 150° C. or lower but exceeding 0° C.

The characteristics before and after processing were compared for each sample.

Table 1 below lists the grain size and frequency data of samples shown in FIG. 7.

TABLE 1

| 325 mesh or less | | 325 mesh or more but 100 mesh or less | |
|---|---|---|---|
| Grain size (μm) | Frequency (%) | Grain size (μm) | Frequency (%) |
| 15.172 | 12.097 | 77.340 | 14.529 |
| 17.377 | 13.552 | 88.583 | 15.842 |
| 19.904 | 13.345 | 101.460 | 13.918 |

FIG. 8 shows an X-ray diffraction spectrum pertaining to a conductive pattern using aluminum powder 1 (FIG. 8(b)) and X-ray diffraction spectrum pertaining to a conductive pattern using aluminum powder 2 (FIG. 8(a)) (measured using the horizontal multipurpose X-ray diffractometer Ultima IV manufactured by Rigaku). The horizontal axis in FIG. 8 represents angle "2θ/°," while the vertical axis represents "Intensity (Diffraction intensity)."

FIG. 8(a) shows the characteristics of Al powder 2 having an average grain size of 93.3 μm, or specifically characteristics e after roller pressurization, characteristics f before pressurization, and characteristics g after the heating pressurization according to the present invention. FIG. 8(b) shows the characteristics of Al powder 1 having an average grain size of 18.0 μm, or specifically characteristics h after roller pressurization, characteristics i before pressurization, and characteristics j after the heating pressurization according to the present invention.

Table 2 below lists the angle "2θ/°" and "Intensity (Diffraction intensity)" data of samples shown in FIG. 8.

TABLE 2

| Before pressurization | | After roller pressurization | | After heating pressurization (present invention) | |
|---|---|---|---|---|---|
| 2θ/(°) | Diffraction intensity | 2θ/(°) | Diffraction intensity | 2θ/(°) | Diffraction intensity |
| Average grain size: 93.3 μm | | | | | |
| 38.62814 | 8515.74274 | 38.61307 | 5489.76715 | 38.56784 | 11333.72 |
| 38.64322 | 8630.72227 | 38.62814 | 5648.02433 | 38.58291 | 12293.67 |
| 38.65829 | 7552.5577 | 38.64322 | 5494.13986 | 38.59799 | 11664.29 |

TABLE 2-continued

| Before pressurization | | After roller pressurization | | After heating pressurization (present invention) | |
|---|---|---|---|---|---|
| 2θ/(°) | Diffraction intensity | 2θ/(°) | Diffraction intensity | 2θ/(°) | Diffraction intensity |
| Average grain size: 18.0 μm | | | | | |
| 38.55711 | 14893.0241 | 38.55110 | 11333.71564 | 38.60521 | 11838.26 |
| 38.56313 | 15145.9188 | 38.55711 | 12293.66667 | 38.61122 | 12051.30 |
| 38.56914 | 14955.8563 | 38.56313 | 11664.28725 | 38.61723 | 12033.07 |

Also, Table 3 below lists the crystallite sizes, lattice pitches, distortions and stresses calculated using these diffraction peaks observed.

TABLE 3

| | 2θ max/° | Half value width/° | Crystallite/ nm | Lattice pitch/nm | Distortion ε/% | Stress σ (MPa) | Sheet resistance Ω/□ |
|---|---|---|---|---|---|---|---|
| Average grain size: 93.3 μm | | | | | | | |
| Before pressurization | 38.64 | 0.107 | 78.7 | 0.2329 | | | Could not be measured. |
| After heating pressurization per present invention | 38.59 | 0.114 | 73.8 | 0.2331 | 0.125 | 86.0 | 1.0 |
| After roller pressurization | 38.63 | 0.179 | 47.0 | 0.2329 | 0.025 | 17.2 | Could not be measured. |
| Average grain size: 18.0 μm | | | | | | | |
| Before pressurization | 38.56 | 0.099 | 85.0 | 0.2333 | | | Could not be measured. |
| After heating pressurization per present invention | 38.61 | 0.122 | 69.0 | 0.2330 | 0.125 | 86.0 | 0.8 |
| After roller pressurization | 38.55 | 0.138 | 61.0 | 0.2334 | 0.025 | 17.2 | Could not be measured. |

The top fields of Table 3 show the characteristics f, g, e of aluminum powder 2 with an average grain size of 93.3, while the bottom fields show the characteristics i, j, h of aluminum powder 1 with an average grain size of 18.0.

As is evident from Table 3, implementing the heating pressurization according to the present invention resulted in 0.125% of lattice distortion of crystallites in fine aluminum grains, regardless of the size of the fine aluminum grain. Here, formula 1 shown below is used.

σ(Pa)=εE(Pa)    (Formula 1)

Where, σ: stress, ε: distortion, E: Young's modulus (69 GPa for Al)

The stress calculated by this formula was 86 MPa, regardless of the size of the fine aluminum grain, which is greater than 17.2 MPa measured when the general roll pressurization method was used. This result suggests that the heating pressurization method according to the present invention can generate stress in the crystal in fine aluminum grains in a very efficient way. Also note that the corresponding sheet resistance was 0.8Ω for aluminum powder 1 and 1.0Ω for aluminum powder 2.

Since the film thicknesses of surface metal aluminum layers observed on the section photographs of these patterns were approx. 1 μm, the resistivity is calculated as approx. $0.8 \times 10^{-5}$ Ω·cm for aluminum powder 1 and approx. $1.0 \times 10^{-4}$ Ω·cm for aluminum powder 2. Based on these examples, aluminum powder (fine grains) used under the present invention can have given resistivity in a range of $1 \times 10^{-4}$ Ω·cm or lower but $2.65 \times 10^{-6}$ Ω·cm (resistivity of metal aluminum) or higher.

Figure 9:
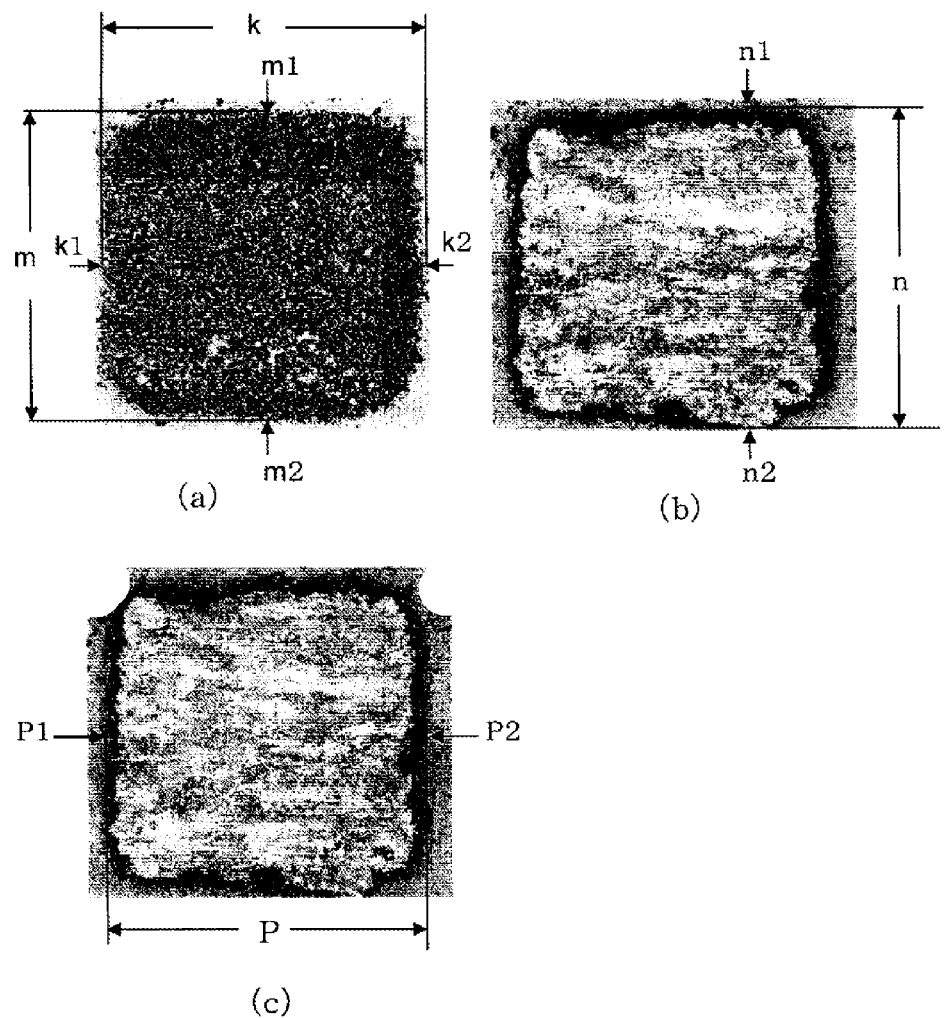
[FIG. 9] are laser confocal microscope images showing pattern deformations of UHF-RFID IC pads to which the heating pressurization method according to the present invention is applied.

FIG. 9 shows the observation results, using a laser confocal microscope (VK-9700 manufactured by Keyence), of change in pattern width when UFH RFID antenna IC pads were printed with a paste using aluminum powder 1.

FIG. 9(a) shows the vertical and horizontal pattern widths of a conductive pattern after printing/heating for removal of solvent, FIG. 9(b) shows the vertical pattern width of a conductive pattern after heating pressurization, and FIG. 9(c) shows the horizontal pattern width of a conductive pattern also after heating pressurization. The horizontal pattern width k in FIG. 9(a) is 629 μμm based on the length between the tips of the arrows k1 and k2, while the vertical pattern width m is 605 μm based on the length between the tips of the arrows m1 and m2. The vertical pattern width n in FIG. 9(b) is 621 μm based on the length between the tips of the arrows n1 and n2, while the horizontal pattern width p in FIG. 9(c) is 629 μm based on the length between the tips of the arrows p1 and p2.

The rates of change in vertical/horizontal pattern widths before and after heating pressurization, as read from FIG. 9, are shown in Table 4.

TABLE 4

| | After printing and drying | After heating pressurization | Rate of change (%) |
|---|---|---|---|
| Vertical width (μm) | 605 | 621 | 2.6 |
| Horizontal width (μm) | 629 | 629 | 0 |

With the heating pressurization method according to the present invention, the rate of change in the pattern was very small, or specifically 2.6% for the rate of change in vertical width and 0% for the rate of change in horizontal width, as shown in Table 4 above, although large stress could be generated in the fine aluminum grains in an efficient manner.

The present invention can also be embodied in a manner as explained below.

The present invention can be embodied as a method of manufacturing a conductive substrate, wherein the value of resistivity of the conductive pattern is given in a range of $1\times10^{-4}$ Ω·cm or lower but $2.65\times10^{-6}$ Ω·cm or higher, and when pressure is applied under heating to the crystal lattice of crystallites in the fine aluminum grains constituting the conductive pattern, the lattice is distorted by at least 0.1% compared to the state after printing/drying (heating for removal of solvent), so that this distortion of the lattice can be observed as a peak shift of 0.05° or more on an X-ray diffraction graph representing the aluminum crystal (111) plane.

The present invention can also be embodied as a method of manufacturing a conductive substrate, wherein a film-forming pattern is formed to provide that when the film-forming pattern is heated and the solvent in the film-forming pattern is removed and dried, the aspect ratio (pattern height/pattern width) of the conductive pattern of 0.1 or less and that the deformation ratio of the pattern width when comparing the pattern width after heating of the film-forming pattern and removal/drying of the solvent in the film-forming pattern width after heating pressurization is within 10%.

The invention claimed is:

1. A method of manufacturing a conductive substrate, comprising:
   forming a film-forming pattern on a plastic substrate using a conductive paste having a given amount of fine aluminum grains dispersed in a binder constituted by a solvent and an insulating resin;
   removing the solvent from the film-forming pattern and drying the film-forming pattern by heating; and
   pressurizing a surface of the solvent-removed film-forming pattern containing the fine aluminum grains, opposite to the substrate, in both the horizontal direction and vertical direction to produce a conductive pattern where an insulating aluminum oxide film present on surfaces of the fine aluminum grains is broken, wherein the pressurizing step comprises:
   pressing a pressuring roller against the film-forming pattern on the substrate in the vertical direction and simultaneously rotating the roller to exert force on the film-forming pattern in a direction parallel to the substrate surface while exerting pressure against the film-forming pattern in the vertical direction; and
   simultaneously moving the substrate relative to the roller in a direction parallel to the substrate surface,
   wherein as a result of the pressurizing step, the fine aluminum grains undergo plastic deformation, and the insulating aluminum oxide film present on the surfaces of the fine aluminum grains is broken, thereby forming conductive junctions connecting the fine aluminum grains to each other.

2. A method of manufacturing a conductive substrate according to claim 1, wherein the process temperature used in the pressurizing step is given in a range of 150° C. or lower but exceeding 0° C.

3. A method of manufacturing a conductive substrate according to claim 1, wherein the value of resistivity of the conductive pattern is given in a range of $1\times10^{-4}$ Ω·cm or lower but $2.65\times10^{-6}$ Ω·cm or higher, except for $1.5\times10^{-5}$ Ω·cm, and in the pressurizing step, pressure is applied to the crystal lattice of crystallites in the fine aluminum grains constituting the conductive pattern so that the lattice is distorted by at least 0.1% compared to the state before the pressurizing step, wherein this distortion of the lattice can be observed as a peak shift of 0.05° or more on an X-ray diffraction graph representing the aluminum crystal (111) plane.

4. A method of manufacturing a conductive substrate according to claim 1, wherein the film-forming pattern is formed to provide an aspect ratio of the conductive pattern of 0.1 or less as measured after removing the solvent from the film-forming pattern, and the pressurizing step is conducted so that a deformation ratio of the pattern width when comparing the pattern width before and after the pressurizing step is within 10%.

5. A method of manufacturing a conductive substrate according to claim 2, wherein the value of resistivity of the conductive pattern is given in a range of $1\times10^{-4}$ Ω·cm or lower but $2.65\times10^{-6}$ Ω·cm or higher, except for $1.5\times10^{-5}$ Ω·cm, and in the pressurizing step, pressure is applied to the crystal lattice of crystallites in the fine aluminum grains constituting the conductive pattern so that the lattice is distorted by at least 0.1% compared to the state before the pressurizing step, wherein this distortion of the lattice can be observed as a peak shift of 0.05° or more on an X-ray diffraction graph representing the aluminum crystal (111) plane.

6. A method of manufacturing a conductive substrate according to claim 2, wherein the film-forming pattern is formed to provide an aspect ratio of the conductive pattern of 0.1 or less as measured after removing the solvent from the film-forming pattern, and the pressurizing step is conducted so that a deformation ratio of the pattern width when comparing the pattern width before and after the pressurizing step is within 10%.

7. A method of manufacturing a conductive substrate according to claim 3, wherein the film-forming pattern is formed to provide an aspect ratio of the conductive pattern of 0.1 or less as measured after removing the solvent from the film-forming pattern, and the pressurizing step is conducted so that a deformation ratio of the pattern width when comparing the pattern width before and after the pressurizing step is within 10%.

8. A method of manufacturing a conductive substrate according to claim 1, wherein the fine aluminum grains dispersed in the binder has a grain size of more than 10 μm but no more than 100 μm, and have a spherical, scale-like or branch-like shape.

\* \* \* \* \*